(12) United States Patent
Purcell

(10) Patent No.: US 8,578,078 B1
(45) Date of Patent: Nov. 5, 2013

(54) VALID LATENCY FOR PROGRAMMABLE CHIP COMPONENTS

(75) Inventor: Chris John Purcell, High Wycombe (GB)

(73) Assignee: Altera Corporation, San Jose, CA (US)

( * ) Notice: Subject to any disclaimer, the term of this patent is extended or adjusted under 35 U.S.C. 154(b) by 722 days.

(21) Appl. No.: 12/053,240

(22) Filed: Mar. 21, 2008

(51) Int. Cl.
*G06F 13/372* (2006.01)

(52) U.S. Cl.
USPC .......................................................... 710/124

(58) Field of Classification Search
USPC .......................................................... 710/124
See application file for complete search history.

(56) References Cited

U.S. PATENT DOCUMENTS

| | | | |
|---|---|---|---|
| 6,654,308 B1 * | 11/2003 | Carter ...................... | 365/189.14 |
| 2004/0111546 A1 * | 6/2004 | Dhong et al. .................. | 710/100 |
| 2004/0236882 A1 * | 11/2004 | Simpson et al. ................ | 710/52 |
| 2008/0294929 A1 * | 11/2008 | Tune et al. .................... | 713/600 |

OTHER PUBLICATIONS

Rapid IO, "Synopsis of the Data Streaming Logical Specification (Phase I)," Rev. 1.2, Aug. 2004, pp, 1-9.

* cited by examiner

*Primary Examiner* — Nimesh G Patel
(74) *Attorney, Agent, or Firm* — Weaver Austin Villeneuve & Sampson LLP

(57) ABSTRACT

Multiple components on a programmable chip are interconnected using a shared bus fabric. Each component has an interface with multiple input lines including an input valid line, an input ready line, and an input data line and multiple output lines including an output valid line, an output ready line, and an output data line. Positive valid latency is provided on the input side while positive ready latency is provided on the output side. Adapters are inserted automatically between components to allow implementation of interfaces without buffers.

23 Claims, 11 Drawing Sheets

| Clock Edge 101 | Ready 103 | Valid 105 | Data 107 |
|---|---|---|---|
| 1 | 1 | 0 | 0 |
| 2 | 1 | 1 | 0 |
| 3 | 1 | 1 | 1 |
| 4 | 1 | 1 | 2 |
| 5 | 1 | 0 | 2 |
| 6 | 1 | 1 | 3 |
| 7 | 0 | 0 | 3 |
| 8 | 0 | 1 | 4 |
| 9 | 1 | 1 | 4 |

Figure 1

| Clock Edge 201 | Ready 203 | Valid 205 | Data 207 |
|---|---|---|---|
| 1 | 1 | 0 | 0 |
| 2 | 1 | 0 | 0 |
| 3 | 1 | 1 | 0 |
| 4 | 1 | 1 | 1 |
| 5 | 1 | 1 | 2 |
| 6 | 0 | 0 | 2 |
| 7 | 0 | 1 | 3 |
| 8 | 1 | 0 | 4 |
| 9 | 1 | 0 | 4 |
| 10 | 1 | 1 | 4 |

Figure 2

| Clock Edge 501 | Ready 503 | Valid 505 | Data 507 |
|---|---|---|---|
| 1 | 0 | 1 | 0 |
| 2 | 0 | 1 | 0 |
| 3 | 1 | 1 | 0 |
| 4 | 1 | 1 | 1 |
| 5 | 1 | 1 | 2 |
| 6 | 0 | 0 | 2 |
| 7 | 1 | 0 | 3 |
| 8 | 0 | 1 | 4 |
| 9 | 0 | 1 | 4 |
| 10 | 1 | 1 | 4 |

VALID LATENCY FOR PROGRAMMABLE CHIP COMPONENTS

DESCRIPTION OF RELATED ART

The present disclosure relates to methods and apparatus for efficiently connecting components using an interconnection fabric such as a bus on a programmable device.

Current programmable chips including field programmable gate arrays (FPGAs) allow users to select, design, and parameterize components such as processors, timers, hardware accelerators and connect them on a device using an interconnection fabric such as a bus. Components send and receive data using valid and ready lines to indicate when data is available and when a particular component is ready to receive data. In many instances, the clock cycle when data is available and the clock cycle when a component is ready to receive data may not align, limiting throughput and introducing additional hardware complexity in individual components.

Consequently, it is desirable to provide improved methods and apparatus connecting components on programmable devices.

OVERVIEW

Multiple components on a programmable chip are interconnected using a shared bus fabric. Each component has an interface with multiple input lines including an input valid line, an input ready line, and an input data line and multiple output lines including an output valid line, an output ready line, and an output data line. Positive valid latency is provided on the input side while positive ready latency is provided on the output side. Adapters are inserted automatically between components to allow implementation of interfaces without buffers.

These and other features of the present invention will be presented in more detail in the following specification of the invention and the accompanying figures, which illustrate by way of example the principles of the invention.

BRIEF DESCRIPTION OF THE DRAWINGS

The disclosure may best be understood by reference to the following description taken in conjunction with the accompanying drawings, which illustrate particular embodiments of the present invention.

FIG. 1 illustrates one example of a producer component sending a sequence of data to a consumer component.

FIG. 2 illustrates one example of a producer component sending a sequence of data to a consumer component in a positive ready latency system.

FIG. 5 illustrates an example of a producer component sending a sequence of data to a consumer component in a positive valid latency system.

DESCRIPTION OF PARTICULAR EMBODIMENTS

Figure 3:
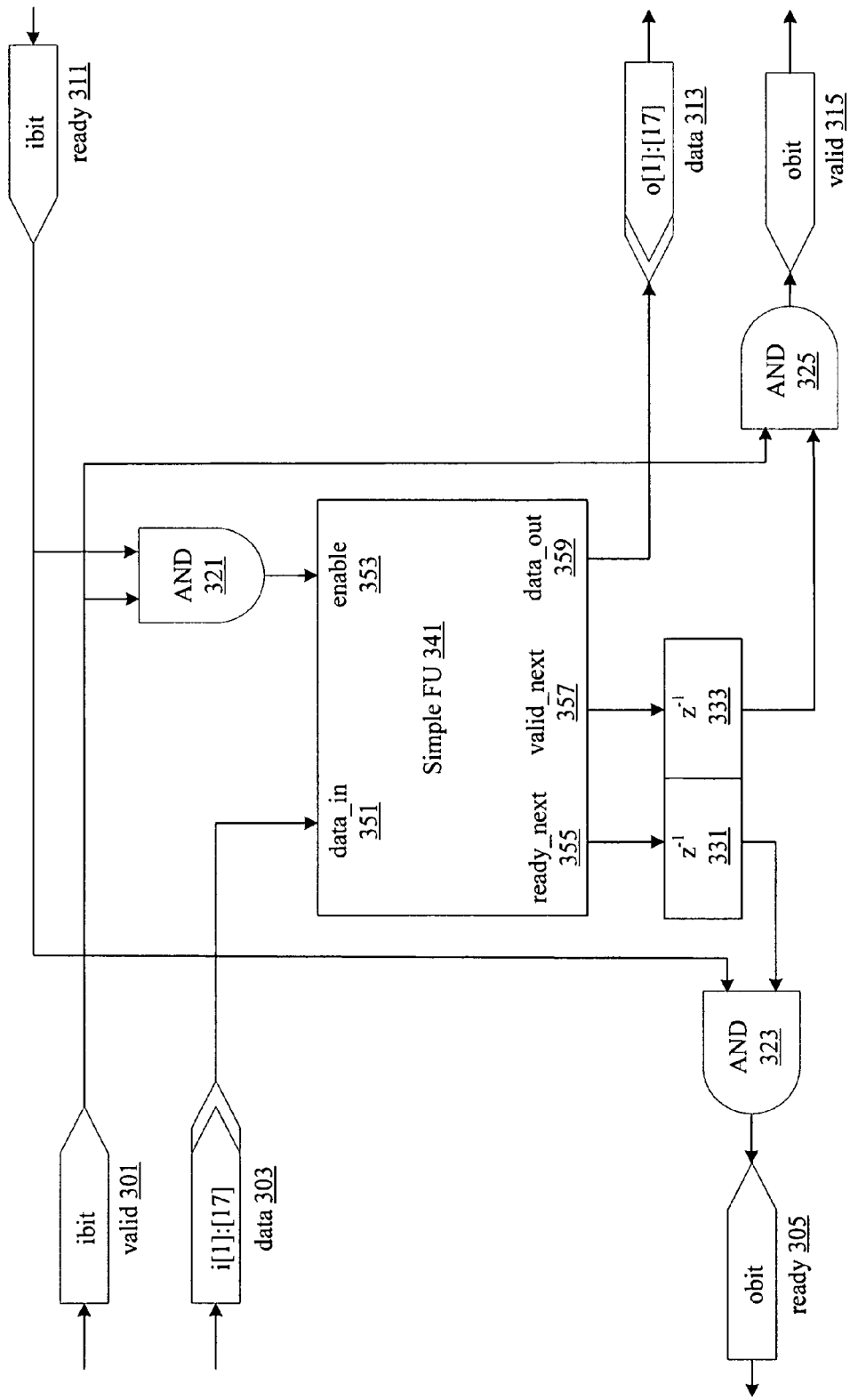
FIG. 3 illustrates one example of signal lines mapped to function unit ports.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of synchronous interconnections between programmable device components. However, it should be noted that the techniques of the present invention can be applied to a number of variations as well. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

A programmable device interconnection fabric allows components to communicate at a specified number of bits per cycle. A data line caries data signals. A valid line indicates when a data producer is emitting valid data. A ready line indicates when a consumer is ready to receive data. In conventional implementations, a consumer signals readiness using the ready line some number of clock cycles in advance of receiving data. To support positive ready latency, the consumer must buffer data at its input. In many instances, buffers are provided in both an interconnection fabric as well as in a component itself, introducing added complexity in component design and implementation.

Implementing a system on a programmable chip is made efficient and manageable by using component based design. Individual components including digital signal processing cores, timers, Ethernet components, etc. are designed and implemented independently. In many instances, these individual components are available from a library of components and can be further parameterized to suit user needs. Other components may be custom designed by individual users. To allow use of these component libraries, a standard bus protocol is provided to allow data transfer between modules. In some instances, a protocol may simply allow unidirectional point-to-point data transfer between modules, or it may allow bi-directional data transfer between multiple modules. In particular embodiments, components and bus protocols are synchronous. Paths in hardware start and end at a register. A clock is used to synchronize these registers. When a clock pulses to cause a clock edge, the registers take the value at their input and move it to their output. The combinational logic between registers, adders, logic gates, etc. propagates these values to the next set of registers before the next clock pulse.

A combinational loop occurs when a piece of combinational logic feeds back into itself without first passing through a register. This occurs for instance, when an adder feeds its result back into itself. According to various embodiments, combinational loops are not allowed in synchronous designs.

According to various embodiments, a programmable chip system streaming bus protocol includes unidirectional point-to-point connections. Data flows from a producer to a consumer. As data may not always be available, a valid line is used to indicate when the information transmitted on the data lines is valid. As the consumer may not always be prepared to accept new data, a ready line is used to indicate when the information transmitted on the data lines will be consumed, and when it should be repeated. Other data including metadata may also be provided using the streaming bus protocol.

In a simple example, the producer indicates whether the data is valid on each clock edge, and the consumer indicates whether it will consume the data. If the data is not valid and the consumer not ready, nothing happens. If the data is not valid and the consumer ready, the consumer must wait for the next clock edge. If the data is valid but the consumer not ready, the producer must repeat the data next clock edge. Finally, if the consumer is ready and the data is valid, the consumer processes it, and the producer moves on to the next item of data.

An observer can determine what data is actually transmitted by ignoring any clock edges where either valid or ready is not asserted.

FIG. 1 illustrates one example of a producer sending a sequence of 0, 1, 2, 3, and 4 to a consumer using clock edge 101, ready signal 103, valid signal 105, and data line 107. At clock edge 1, the ready line is 1 and the valid line is 0, so the consumer is ready but no valid data is available. At clock edge 2, the ready line is 1 and the valid line is 1, so the data value at the consumer is set to the first sequence value of 0. At clock edge 3, the ready line is 1 and the valid line is 1, so the consumer is ready and the data is valid. The data is set to the next sequence value of 1. At clock edge 4, the ready line is 1 and the valid line is 1, so the consumer is ready and the data is valid. The data is set to the next sequence value of 2. At clock edge 5, the ready line is 1 and the valid line is 0, so the consumer is ready but the data is not valid. The data value remains 2. At clock edge 6, the ready line is 1 and the valid line is 1, so the consumer is ready and the data is valid. The data value is set to 3. At clock edge 7, neither the ready line nor the valid line is asserted, and the data remains set to 3. At clock edge 8, only the valid line is asserted and the data value is not set. At clock edge 9, both the ready line and the valid line are asserted, and the data is set to 4.

According to various embodiments, the ready signal need not indicate that the consumer is ready on that same clock edge. The producer may find it simpler if the consumer signals readiness a number of clock edges in advance. This lag between indicating readiness and valid data arriving is called ready latency. For the example in FIG. 1, the ready latency is 0.

FIG. 2 illustrates an example of a producer feeding a consumer the same sequence, but in a ready latency 2 system with clock edge 201, ready signal 203, valid signal 205, and data line 207. At clock edges 1 and 2, the valid line is 0, so no data is set. At clock edge 3, the valid line is set and the ready line was set at clock edge 1, so the data is set to 0, or the first value in the data sequence. At clock edge 4, the valid line is set and the ready line was set at clock edge 2, so the data is set to 1, or the next value in the data sequence. At clock edge 5, the valid line is set and the ready line was set at clock edge 3, so the data is set to 2, or the next value in the data sequence. At clock edge 6, both the ready and valid lines are not asserted, and the data remains set to 2. At clock edge 7, the valid line is set and the ready line was set at clock edge 5, so the data is set to the next data sequence value of 3. The data is set to 3 at clock edge 7 even though the ready line is not asserted at clock edge 7. At clock edges 8 and 9, the valid line is not asserted and the data remains unchanged. At clock edge 10, both the valid and ready lines are asserted and the data is set to 4.

According to various embodiments, another rule is imposed when the ready latency is 1 or higher: the valid signal may never be high if the consumer is not ready for data on that clock edge (e.g. if the ready signal was low the relevant numbers of edges earlier). This makes determining what data is transmitted simple. If the valid signal is high, the data is valid.

According to various embodiments, a component or module includes a hardware functional unit (FU), which may consume an item of data from port data in and may emit an item of data from port data out during a clock edge. The component or module indicates whether it will consume or emit data on the next clock edge using ports ready_next and valid_next respectively. In particular embodiments, the component is externally enabled or disabled using a clock enable signal through port ena. If the enable signal is low at the start of a clock edge, the block acts as if that clock edge never happened.

To provide streaming buses with the ability to transmit data, the ready and valid signals of the protocol need to be mapped onto the ports provided by the FU. FIG. 3 illustrates one example of signal lines mapped to function unit ports.

An input valid bit 301 and an input ready bit 311 are provided to enable port 353 through AND gate 321. If both the input valid bit 301 and the input ready bit 311 are set, input data 303 is read at data input port 351. The function unit 341 processes the data and provides the data on output port 359 to data output line 313. The ready_next and valid next outputs ports 355 and 357 are delayed one cycle at 331 and 333 and provided to AND gates 323 and 325. If both an input ready line 311 and a ready_next line 355 delayed by one cycle are both asserted, the output ready line 305 is asserted. If both an input valid line 301 and a valid next line 357 delayed by one cycle are asserted, and output valid line 315 is asserted and data 313 can be read.

However, input ports fed directly from combinational logic are problematic. For example, if several such modules were chained together, the valid signal at the start would have to feed the enable port of every register in the entire design. Such a global enable yields poor quality results.

In particular embodiments, it would be helpful if the input valid line 301 and the input ready line 311 could be fed into a register. This can be done for the output bus by choosing ready latency 1: the ready signal will now come in one clock edge earlier. However, the input bus has no corresponding option. Instead, designers must place a small buffer before one of the buses, driving the various signals based on how full the buffer is.

Figure 4:
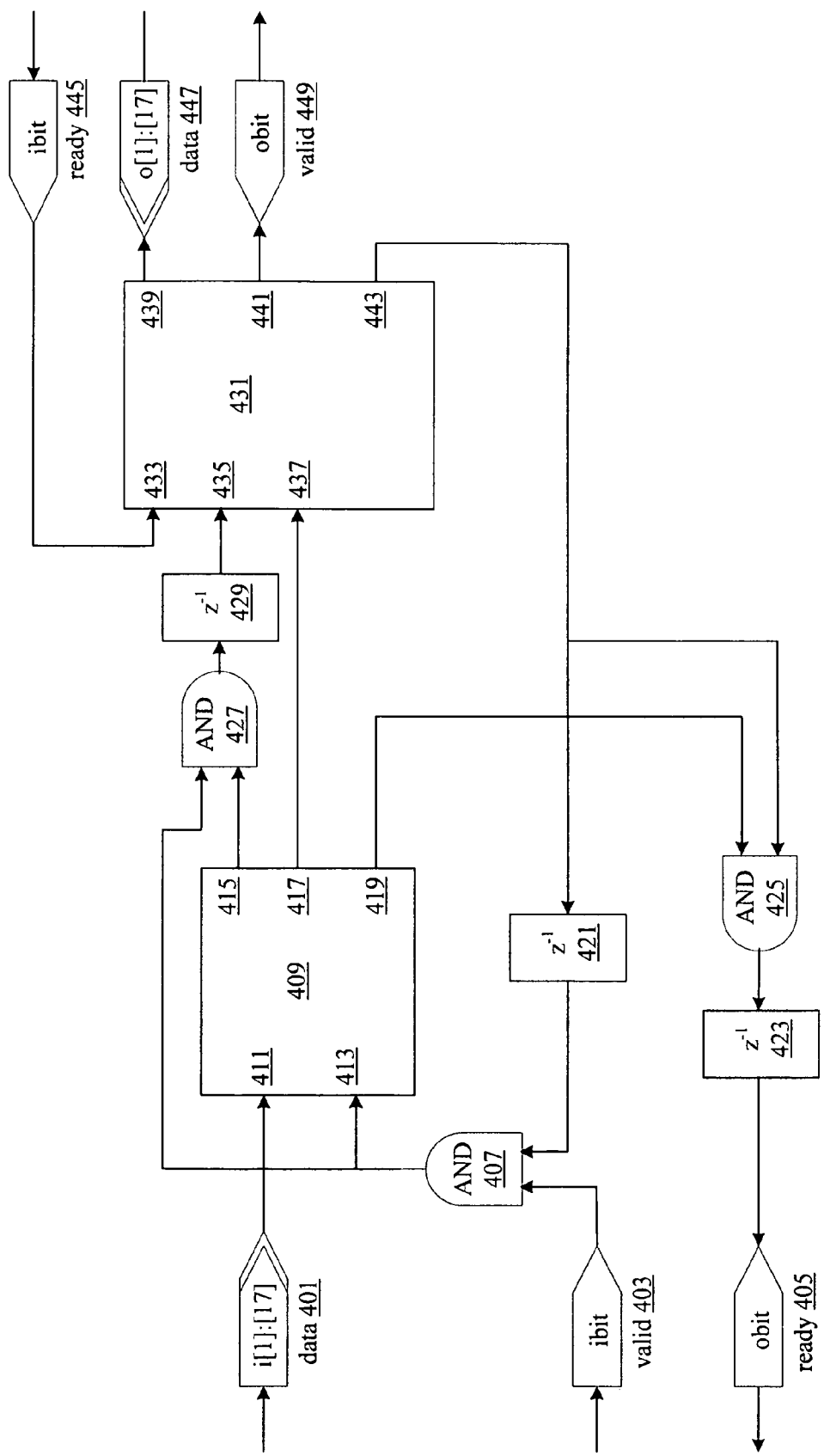
FIG. 4 illustrates one example of a system having an input port buffer.

FIG. 4 illustrates one example of a system having an input port buffer. A data line 401 provides data to a data input port 411 in function unit 409. An input valid line 403 is combined at an AND gate 407 with a buffer space available line 443 delayed at delay element 421. The combined signal from the AND gate 407 is provided to enable port 413 and to AND gate 427. The function unit 409 processes data and provides data on a data output 417 to buffer 431 when push input port 435 on buffer 431 is asserted. The valid_next line 415 from function unit 409 is combined at AND gate 427 and delayed at element 429 to assert the push port at buffer 431. Data is popped from the buffer when the input ready line 445 is asserted at buffer pop port 433. Output data is provided at 447 from data_out port 439. The output valid line 449 is asserted when the non-empty port at buffer 431 is asserted.

The not_nearly_full line 443 is combined with the read next 419 line at AND gate 425 and delayed at delay element 423 to provide output ready bit 405. Including a buffer in a component interface is non-trivial and can often cause a number of glitches. If the ready/valid timing patterns of adjacent modules do not match, a buffer must be placed between them to smooth out irregularities and enable maximum throughput. For instance, suppose one module produced data on alternating cycles (101010 . . . ), while the next consumes three pieces of data at a time followed by a three-cycle pause to process (111000111000 . . . ). If connected directly, the two modules will be able to communicate data only on three out of every eight cycles—a 25% drop in throughput. In many workloads (e.g. video processing), data will be less predictable than this, and the buffer must be quite large to compensate.

If such a buffer is required anyway, the small internal buffer included in a component is redundant, as it could easily have been subsumed into the larger one. In many cases, this would result in no extra hardware cost, as the memory used to build the buffer comes in fixed sizes in many programmable devices.

If the functional unit being wrapped is large, the time taken to propagate the enable signal to all its components may become larger than can fit between two clock edges. The easiest solution is to place several registers between the logic driving the enable signal and the components being enabled, building an enable tree. The number of components that can be driven by an enable tree grows exponentially with the size of the delay on the enable line, so the latency introduced by this approach is acceptably small.

However, to allow the enable line to be delayed like this, the data in 411 and data out 417 of the function unit 409 must both be buffered. This means two small buffers per module, with around five to ten elements in each, depending on the delay required on the enable line. Building this standard hardware in every module is tedious and a source of potential errors. Furthermore, as before, these buffers could often be combined, with each other and with any external buffer placed between with the module.

According to various embodiments, two modules with different ready latencies cannot be connected directly. In particular embodiments, an adapter is automatically placed between them. The adapter includes a buffer with suitable control logic. In many instances, the control logic is similar to the logic depicted in FIG. 4. If the ready latencies of modules can be determined programmatically, these adapters can be automatically inserted by a wiring tool. Alternatively, if an external buffer is placed between the modules, this buffer can easily compensate for any ready latency differences.

According to various embodiments, the techniques of the present invention allow the responsibility for buffering to be moved from the module writer to the automatic adapter insertion logic, allowing automatic buffer combining and automatic adapter insertion.

The valid signal need not indicate that data is valid on the same cycle. The consumer may find it simpler if the producer signals validity a number of clock edges in advance. This lag between indicating validity and data being consumed is called valid latency. According to various embodiments, the techniques of the present invention support positive valid latency and positive ready latency or positive valid latency and zero ready latency.

FIG. 5 illustrates an example of a system with clock edge 501, ready line 503, valid line 505, and data line 507. At clock edge 1, the ready line is 0 and the valid line is 1 and the data line is 0. At clock edge 2, the ready line is 0 and the valid line is 1 and the data line is 0. At clock edge 3, the ready line is 1 and the valid line is 1 two cycles earlier at clock edge 1, so the data 0 is written at the consumer. At clock edge 4, the ready line is 1 and the valid line is 1 two cycles earlier at clock edge 2, so that data 1 is written at the consumer. At clock edge 5, the ready line is 1 and the valid line is 1 two cycles earlier at clock edge 3, so that data 2 is written at the consumer. At clock edge 6, the ready line is 0 and even though the valid line is 1 two cycles earlier at clock edge 4, the data remains set to 2.

At clock edge 7, the ready line is 1 and the valid line is 1 two cycles earlier at clock edge 5, and the data 3 is written at the consumer. The data is written even though the valid line at clock edge 7 is 0. At clock edges 8 and 9, the ready lines are 0 and the valid lines two cycles earlier are both 0. At clock edge ten, the ready line is 1 and the valid line two cycles earlier is also 1, so the data 4 is written at the consumer.

According to various embodiments, one extra rule is imposed when the valid latency is 1 or more and the ready latency 0: the ready signal may never be high if the producer is not providing data on that clock edge (i.e. if the valid signal was low the relevant numbers of edges earlier). This makes determining what data was transmitted trivial. If the ready signal is high, the data is valid.

Figure 6:
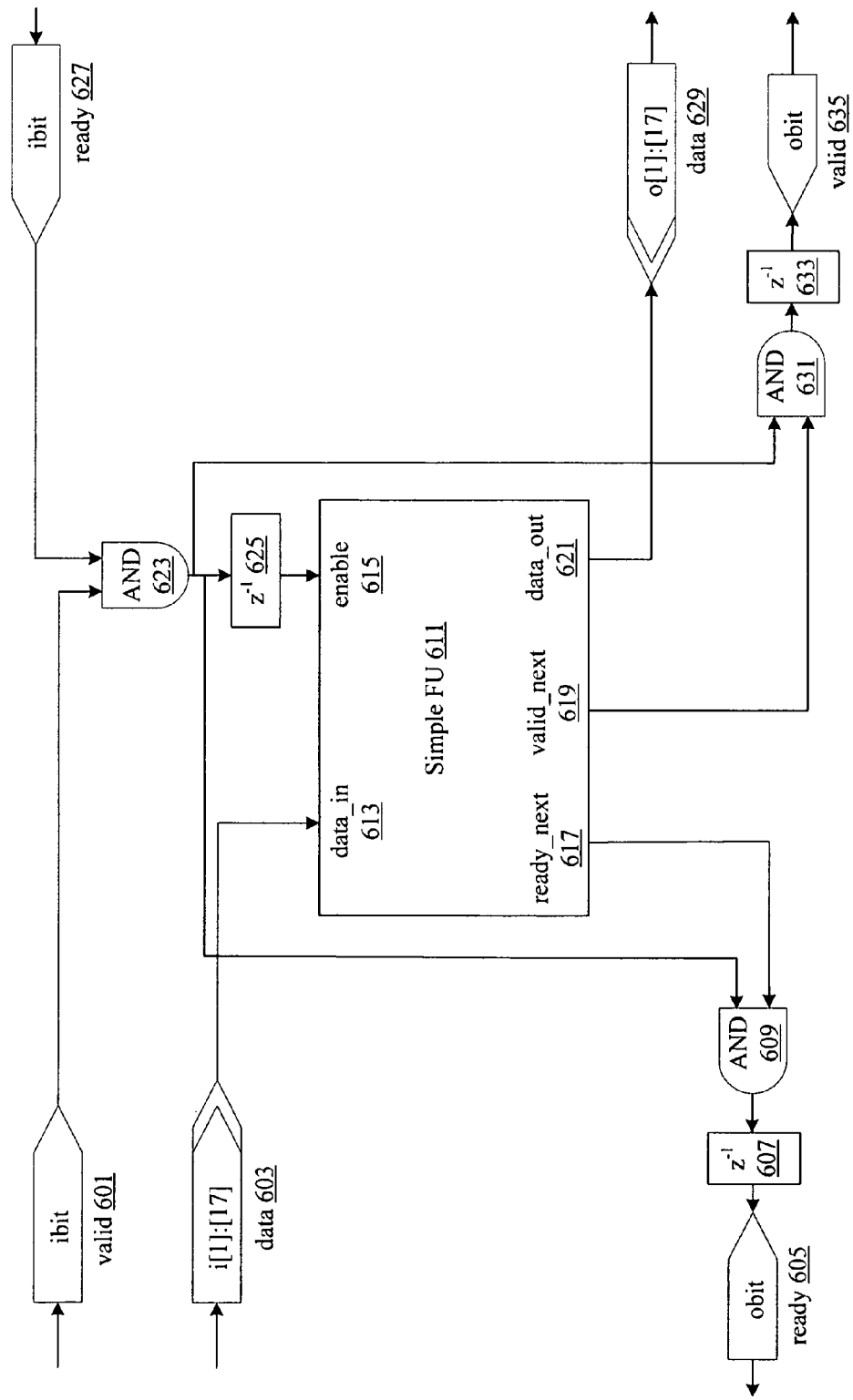
FIG. 6 illustrates one example of a system design with positive valid latency.

FIG. 6 illustrates one example of a design with positive valid latency. According to various embodiments, a design accepts a valid latency +1, ready latency 0 input and a ready latency +1, valid latency 0 output. Module writers need no longer rewrite standard buffer code, saving development time. Additionally, combining small buffers into the larger buffers that must also be placed any to compensate for mismatching data flow patterns saves hardware resources in a finished design.

According to various embodiments, a data input line 603 is provided to data input port 613 in function unit 611. An input valid line 601 and an input ready line 627 are combined at AND gate 623. The output of AND gate 623 is provided to enable port 615 through delay element 625. A function unit 611 performs processing on the data and provides data through data_out port 621 to data output line 629. A ready_next signal 617 is combined at AND gate 609 with the output of AND gate 623 and delayed at element 607 and provided on output ready line 605. The valid_next signal 619 is combined at AND gate 631 with the output of AND gate 623 and delayed at element 633 to provide output valid line 635.

According to various embodiments, the producer must signal when data will be valid some number of cycles in advance, e.g. positive valid latency. The ready signal now indicates whether the consumer has consumed the data. By using a positive valid latency at its start, and a positive ready latency at its end, a module no longer needs to buffer data. In particular embodiments, automatic adapter insertion can place this standard piece of code, or it can be subsumed into a larger buffer.

Figure 7:
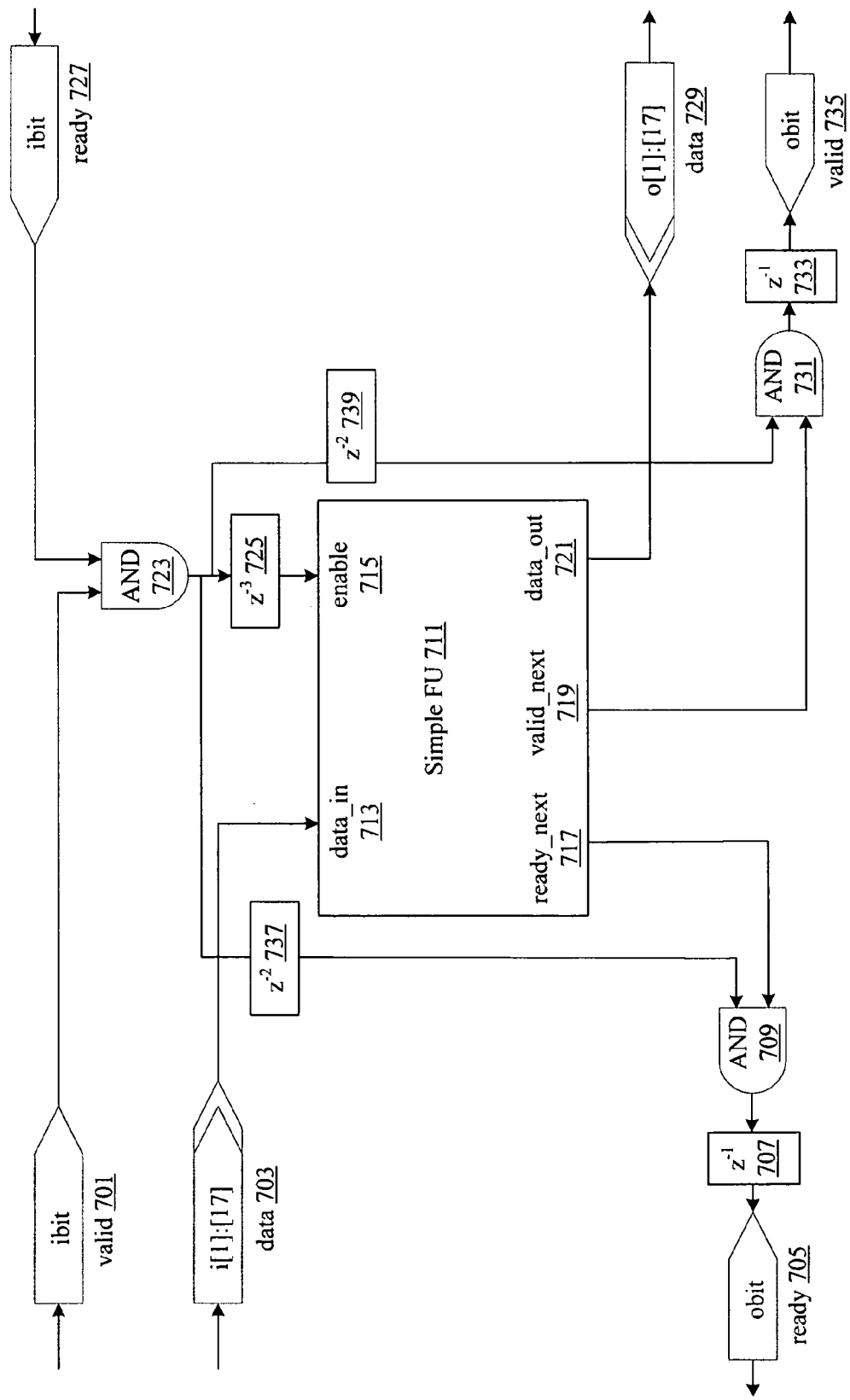
FIG. 7 illustrates one example of a system having positive valid latency at its input and positive ready latency at its output.

If an enable tree is required, the ready latency can be increased. FIG. 7 illustrates a system having valid latency 3 at its input and ready latency 3 at its output.

According to various embodiments, a data input line 703 is provided to data input port 713 in function unit 711. An input valid line 701 and an input ready line 727 are combined at AND gate 723. The output of AND gate 723 is provided to enable port 715 through delay element 725. A function unit 711 performs processing on the data and provides data through data_out port 721 to data output line 729. A ready next signal 717 is combined at AND gate 609 with the element 737 delayed output of AND gate 723 and further delayed at element 707 and provided on output ready line 705. The valid_next signal 719 is combined at AND gate 731 with the element 739 delayed output of AND gate 723 and delayed at element 733 to provide output valid line 735. Delay elements can be adjusted based on a variety of factors, such as the processing time required by a function unit 711.

According to various embodiments, connections can have both positive valid latency and positive ready latency. If valid latency=ready latency, then the ready and valid lines are independent. The data is valid on cycle (c+valid latency) if ready and valid were both high on cycle (c). If valid latency<ready latency, then valid may be high on cycle (c+ready latency−valid latency) only if ready is high on cycle (c), and data is valid on cycle (c+ready latency) if and only if valid is high on cycle (c+ready latency−valid latency). If valid latency>ready latency, then ready may be high on cycle (c+valid latency−ready latency) only if valid is high on cycle (c), and data is valid on cycle (c+valid latency) if and only if ready is high on cycle (c+valid latency−ready latency).

Figure 8:
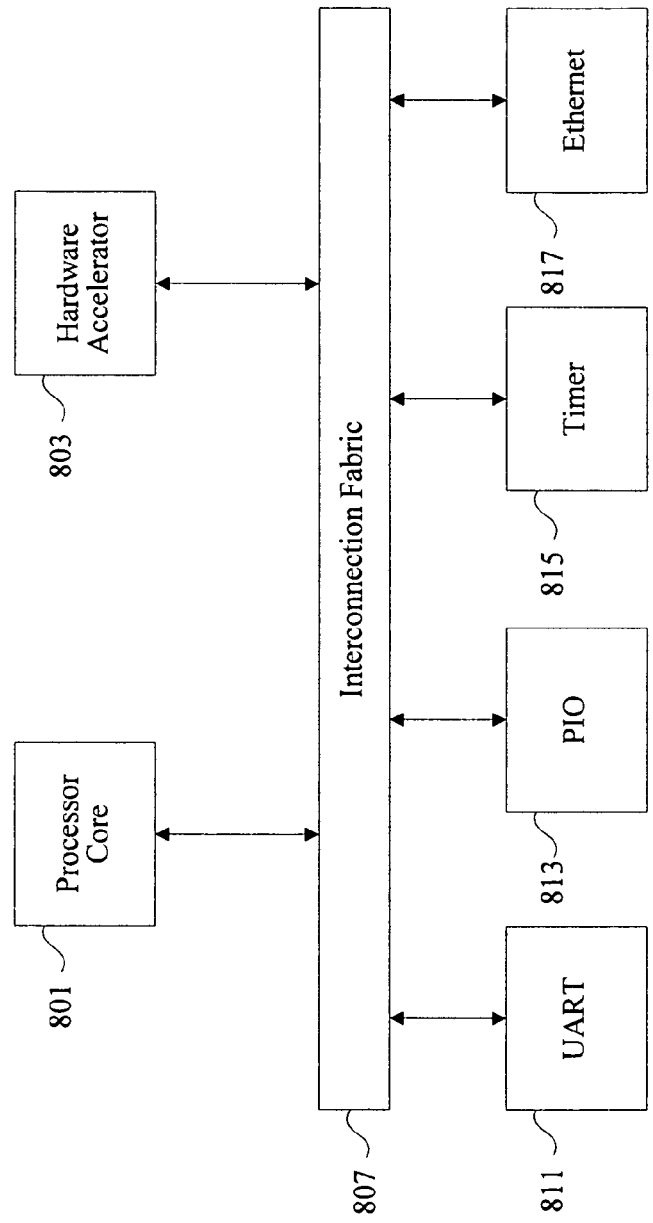
FIG. 8 illustrates one example of a system on a programmable chip that can support positive valid latency

FIG. 8 illustrates one example of a system on a programmable chip that can support positive valid latency. The system includes a processor core, a hardware accelerator, peripheral devices, and peripheral interfaces. Peripheral devices and peripheral interfaces are herein referred to as components. The system on a programmable chip includes processor core 801 and a hardware accelerator 803 as well as peripheral components UART 811, PIO 813, timer 815, and Ethernet 817. In some examples, the hardware accelerator 803 is a Digital Signal Processing (DSP) core, a cryptography accelerator, or a video processor. The components are interconnected using an interconnection fabric 807. Any mechanism or logic for connecting components in a system is referred to herein as an interconnection fabric or bus.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

Figure 9:
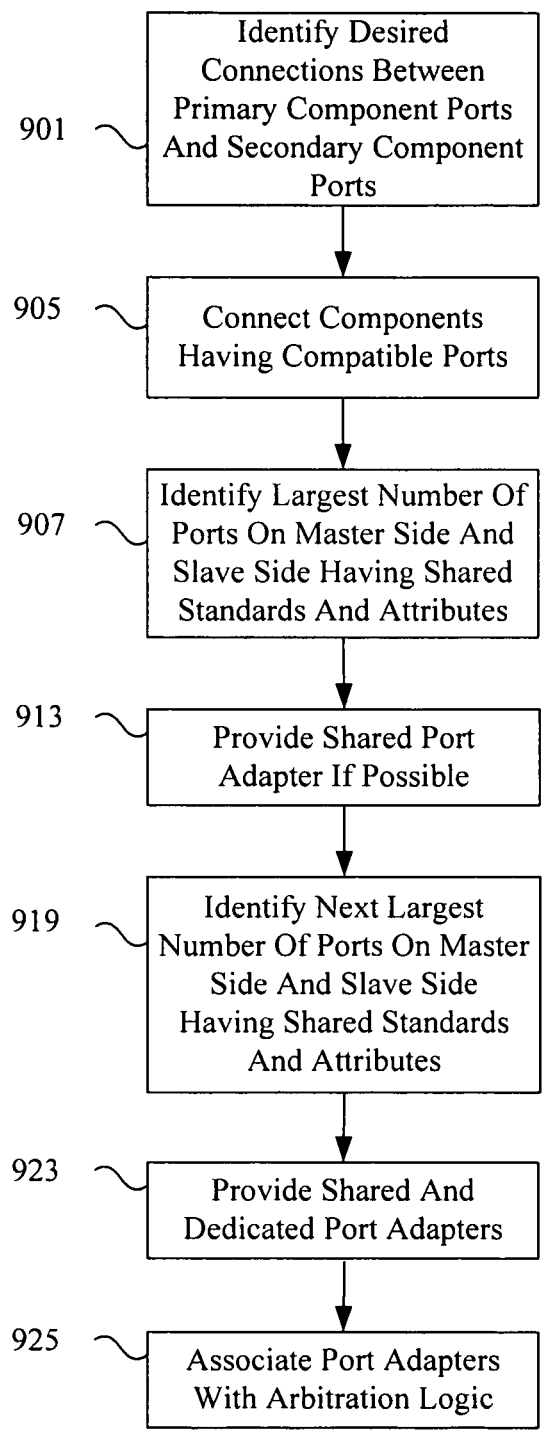
FIG. 9 is a flow process diagram showing one technique for implementing a system using port adapters.

FIG. 9 is a flow process diagram showing one technique for implementing a system using port adapters. At 901, desired connections between primary component ports and secondary components ports are identified. At 905, components having available compatible ports are connected. At 907, the largest number of remaining ports on the master side and/or slave side having shared standards and attributes are identified. A shared port adapter is provided if possible at 913. At 919, the next largest number of remaining unconnected ports on the master side and/or slave side having shared standards and attributes are identified and a shared port adapter is provided. At 923, additional shared and dedicated port adapters are provided. At 925, port adapters are associated with arbitration logic. It should be noted that a variety of techniques are contemplated for selecting ports adapters. Iterative, cot weighting, and graphing techniques can be used.

Figure 10:
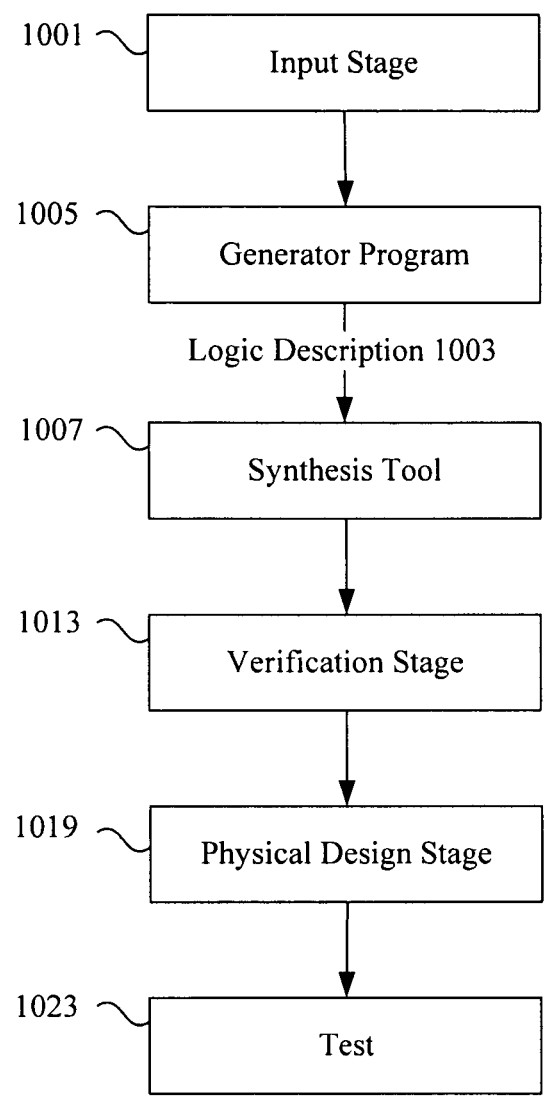
FIG. 10 is a diagrammatic representation showing implementation of an electronic device.

FIG. 10 is a diagrammatic representation showing implementation of an electronic device. An input stage 1001 receives selection information typically from a user for logic such as a processor core as well as other components such as a streaming output device to be implemented on an electronic device. In one example, the input received is in the form of a high-level language program. A generator program 1005 creates a logic description and provides the logic description along with other customized logic to any of a variety of synthesis tools, place and route programs, and logic configuration tools to allow a logic description to be implemented on an electronic device.

In one example, an input stage 1001 often allows selection and parameterization of components to be used on an electronic device. The input stage 1001 also allows configuration of variable or fixed latency support. In some examples, components provided to an input stage include intellectual property functions, megafunctions, and intellectual property cores. The input stage 1001 may be a graphical user interface using wizards for allowing efficient or convenient entry of information. The input stage may also be a text interface or a program reading a data file such as a spreadsheet, database table, or schematic to acquire selection information. The input stage 1001 produces an output containing information about the various modules selected.

In typical implementations, the generator program 1005 can identify the selections and generate a logic description with information for implementing the various modules. The generator program 1005 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1005 identifies pointers and provides ports for each pointer. One tool with generator program capabilities is System on a Programmable Chip (SOPC) Builder available from Altera Corporation of San Jose, Calif. The generator program 1005 also provides information to a synthesis tool 1007 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool.

The HDL files at this point may also be passed to a simulation tool 1009.

As will be appreciated by one of skill in the art, the input stage 1001, generator program 1005, and synthesis tool 1007 can be separate programs. The interface between the separate programs can be a database file, a log, or simply messages transmitted between the programs. For example, instead of writing a file to storage, the input stage 1001 can send messages directly to the generator program 1005 to allow the generator program to create a logic description. Similarly, the generator program can provide information directly to the synthesis tool instead of writing HDL files. Similarly, input stage 1001, generator program 1005, and synthesis tool 1007 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1007.

A synthesis tool 1007 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1013 typically follows the synthesis stage 1007. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1013, the synthesized netlist file can be provided to physical design tools 1019 including place and route and configuration tools. A place and route tool typically locates logic cells on specific logic elements of a target hardware device and connects wires between the inputs and outputs of the various logic elements in accordance with logic required to implement an electronic design. The device can also be physically tested at 1023.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 1001, the generator program 1005, the synthesis tool 1007, the verification tools 1013, and physical design tools 1019 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 11:
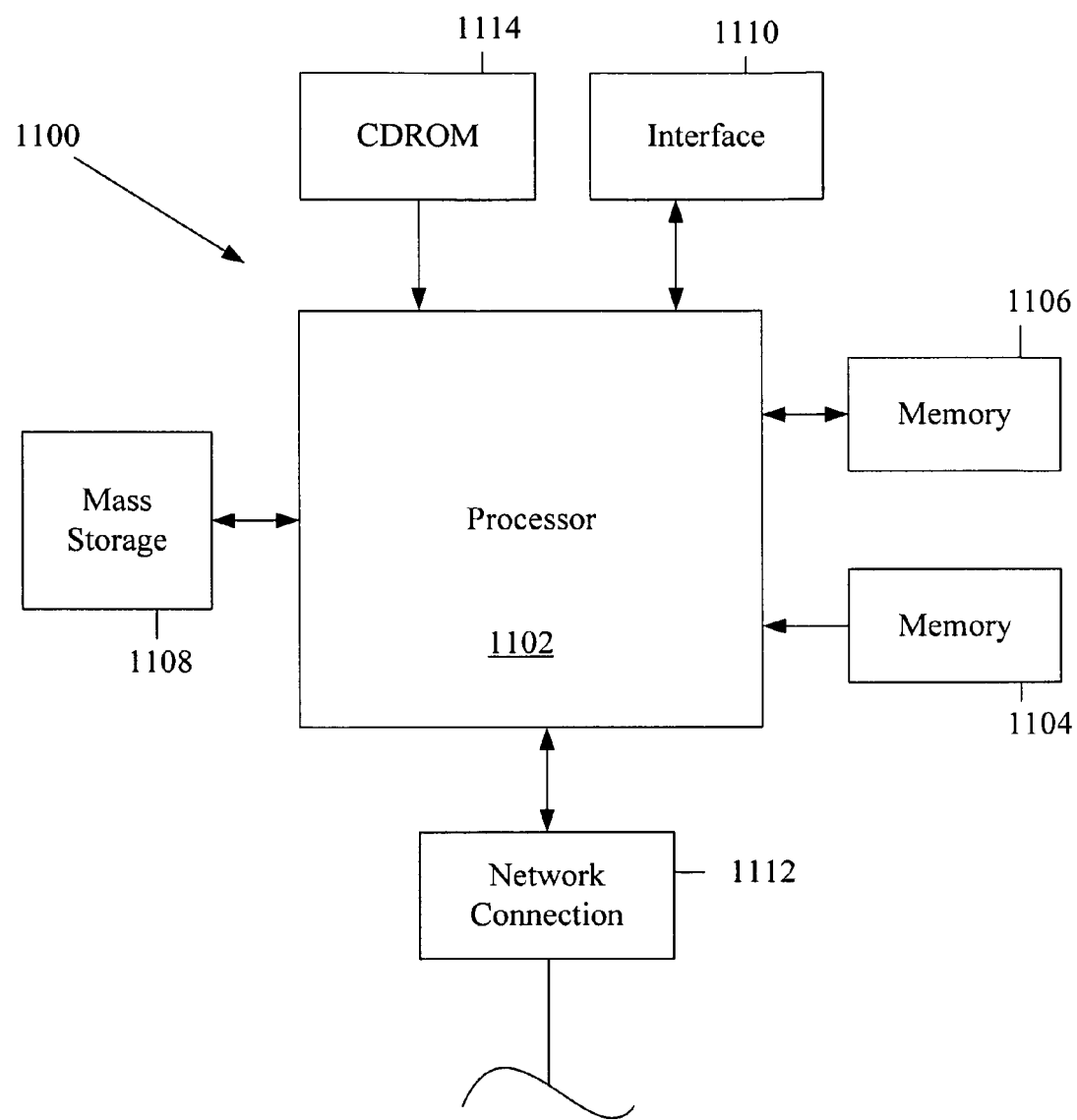
FIG. 11 is a diagrammatic representation showing one example of a computer system.

FIG. 11 is a diagrammatic representation showing a typical computer system that can be used to implement a programmable chip having bus arbitration with priority encoding and fairness. The computer system 1100 includes any number of processors 1102 (also referred to as central processing units, or CPUs) that are coupled to devices including memory 1106 (typically a random access memory, or "RAM"), memory 1104 (typically a read only memory, or "ROM"). The processors 1102 can be configured to generate a test sequences for any designated processor. As is well known in the art, memory 1104 acts to transfer data and instructions uni-directionally to the CPU and memory 1106 is used typically to transfer data and instructions in a bi-directional manner.

Both of these memory devices may include any suitable type of the computer-readable media described above. A mass storage device 1108 is also coupled bi-directionally to CPU 1102 and provides additional data storage capacity and may include any of the computer-readable media described above. The mass storage device 1108 may be used to store programs, data and the like and is typically a secondary storage medium such as a hard disk that is slower than memory. The mass storage device 1108 can be used to hold a library or database of prepackaged logic or intellectual property functions, as well as information on generating particular configurations. It will be appreciated that the information retained within the mass storage device 1108, may, in appropriate cases, be incorporated in standard fashion as part of memory 1106 as virtual memory. A specific mass storage device such as a CD-ROM 1114 may also pass data uni-directionally to the CPU.

CPU 1102 is also coupled to an interface 1110 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1102 optionally may be coupled to a computer or telecommunications network using a network connection as shown generally at 1112. With such a network connection, it is contemplated that the CPU might receive information from the network, or might output information to the network in the course of performing the above-described method steps. It should be noted that the system 1100 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 1108 or 1114 and executed on CPU 1108 in conjunction with primary memory 1106.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of master and slave components and should not be restricted to the ones mentioned above. It is therefore intended that the invention be interpreted to include all variations and equivalents that fall within the true spirit and scope of the present invention.

What is claimed is:

1. A system, comprising:
a consumer component comprising an enable port, a ready next port, a valid next port, and an input data port, wherein:
the enable port is coupled with an input valid line and an input ready line;
the ready next port is coupled with an output ready line;
a first delay element is disposed between the input valid line and the output ready line, the first delay element further being disposed between the input ready line and the output ready line; and
the consumer component is operable to read data on the input data port at a current clock edge based on the value of the input valid line a predetermined number of clock cycles before the current clock edge.

2. The system of claim 1, wherein the consumer component further comprises a data output port.

3. The system of claim 2, wherein the enable port is coupled with the input ready line, the system further comprising a second delay element between the enable port and the input valid line, wherein the second delay element is located between the enable port and the input ready line.

4. The system of claim 3, wherein the consumer component is coupled with the output ready line, the system further comprising a third delay element provided between the ready next port and the output ready line.

5. The system of claim 3, wherein the consumer component is coupled with an output valid line, the system further comprising a third delay element provided between the valid next port and the output valid line.

6. The system of claim 1, further comprising:
a producer component operable to provide a valid signal to indicate that data is valid in a future clock cycle; and
an adapter operable to couple the producer component with the consumer component.

7. The system of claim 1, further comprising a producer component coupled with the consumer component, wherein the producer component is a processor.

8. The system of claim 1, further comprising:
a producer component; and
an adapter comprising a buffer, wherein the adapter is operable to couple the consumer component with the producer component, wherein the adapter is included in an interconnection fabric.

9. The system of claim 1, wherein the consumer component is selected from a library of components operable to be implemented on a programmable logic device.

10. The system of claim 1, further comprising:
a producer component, wherein the enable port is coupled with the input ready line; and
an adapter including a buffer, the adapter operable to couple the producer component with the consumer component.

11. The system of claim 1, wherein the valid next port is operable to provide a signal.

12. The system of claim 1, wherein the ready next port is other than the enable port or the valid next port.

13. The system of claim 1, wherein the valid next port is operable to provide a valid signal during a clock edge next to the current clock edge, wherein the current clock edge comprises an edge at which the input signal is received by the enable port.

14. An apparatus comprising:
means for producing; and
means for consuming coupled with the means for producing, the means for consuming having means for enabling, means for indicating readiness in emitting valid data during a next clock cycle, means for indicating readiness to consume data during the next clock cycle, and means for receiving data, wherein:
the means for enabling is coupled with an input valid line and an input ready line;
the means for indicating readiness to consume data is coupled with an output ready line;
a first means for delaying is disposed between the input valid line and the output ready line, the first delay means for delaying further being disposed between the input ready line and the output ready line; and
the means for consuming includes means for reading data from the means for receiving data at a current clock edge based on the value of the input valid line a predetermined number of clock cycles before the current clock edge.

15. The apparatus of claim 14, wherein the means for consuming further comprises means for providing data.

16. The apparatus of claim 15, wherein the means for enabling is coupled with the input ready line, the apparatus further comprising second means for delaying between the means for enabling and the input valid line, wherein the second means for delaying is located between the means for enabling and the input ready line.

17. The apparatus of claim 16, wherein the means for consuming is coupled with the output ready line, the system further comprising a third means for delaying provided between the means for indicating readiness in consuming data during the next clock cycle and the output ready line.

18. The apparatus of claim 16, wherein the means for consuming is coupled with an output valid line, the system further comprising a third means for delaying provided between the means for indicating readiness in emitting valid data during the next clock cycle and the output valid line.

19. The apparatus of claim 14, further comprising means for adapting including means for buffering, the means for adapting for coupling the means for producing with the means for consuming.

20. A programmable logic device, comprising:
a first function block comprising an enable port, a ready next port, a valid next port, and an input data port, wherein:
the enable port is coupled with an input valid line and an input ready line;
the ready next port is coupled with an output ready line;

a first delay element is disposed between the input valid line and the output ready line, the first delay element further being disposed between the input ready line and the output ready line; and the first function block is operable to read data on the input data port at a clock cycle based on the value of the input valid line a predetermined number of clock cycles before a clock cycle.

21. The programmable logic device of claim 20, wherein the first function block further comprises a data output port.

22. The programmable logic device of claim 21, wherein the enable port is coupled with the input ready line, the programmable logic device further comprising a second delay element between the enable port and the input valid line, wherein the second delay element is located between the enable port and the input ready line.

23. The programmable logic device of claim 20, further comprising:

a second function block; and an adapter including a buffer, wherein the adapter is operable to couple the first function block with the second function block.

* * * * *